United States Patent [19]

Fukuzawa et al.

[11] Patent Number: 4,783,425

[45] Date of Patent: Nov. 8, 1988

[54] FABRICATION PROCESS OF SEMICONDUCTOR LASERS

[75] Inventors: Tadashi Fukuzawa; Yuichi Ono; Shinichi Nakatsuka; Takashi Kajimura, all of Tokyo, Japan

[73] Assignee: Hitachi, Ltd., Tokyo, Japan

[21] Appl. No.: 924,774

[22] Filed: Oct. 30, 1986

[30] Foreign Application Priority Data

Nov. 6, 1985 [JP] Japan .............................. 60-247019
Dec. 18, 1985 [JP] Japan .............................. 60-282854

[51] Int. Cl.$^4$ .................. H01L 21/205; H01L 21/225; H01L 21/265
[52] U.S. Cl. ........................................ 437/46; 437/90; 437/107; 437/129; 437/162
[58] Field of Search ................... 357/17; 437/89, 90, 437/91, 92, 107, 129, 162, 46

[56] References Cited

U.S. PATENT DOCUMENTS

| | | | |
|---|---|---|---|
| 4,329,660 | 5/1982 | Yano et al. | 357/17 X |
| 4,360,919 | 11/1982 | Fujiwara et al. | 148/171 X |
| 4,566,171 | 1/1986 | Nelson et al. | 29/569 L |
| 4,567,060 | 1/1986 | Hayakawa et al. | 427/87 |
| 4,569,721 | 2/1986 | Hayakawa et al. | 156/649 |
| 4,585,491 | 4/1986 | Burnham et al. | 148/1.5 |
| 4,635,268 | 1/1987 | Motegi et al. | 357/17 X |
| 4,667,332 | 5/1987 | Mihashi et al. | 357/17 X |

FOREIGN PATENT DOCUMENTS 0090787 8/1978 Japan ............................ 357/17

Primary Examiner—Olik Chaudhuri
Attorney, Agent, or Firm—Antonelli, Terry & Wands

[57] ABSTRACT

A p-GaAlAs cladding layer is exposed to the air if a groove of the form of a stripe is formed by chemical etching in an n-GaAs layer that serves as a current confinement layer on the p-GaAlAs cladding layer, the groove being so formed as to reach the cladding layer. The GaAlAs is oxidized so easily that an unstable degradation layer is formed on the surface thereof. To solve this problem according to the prior art, an undoped GaAs layer that serves as a cover layer is formed on the p-GaAlAs cladding layer, the n-GaAs layer is formed, and the etching is effected so that the undoped GaAs layer is simply exposed. The undoped GaAs layer is then heated in the MBE apparatus while being irradiated with the As molecular beam and is thermally etched. Therefore, the cladding layer is exposed in vacuum and the p-GaAlAs layer is formed thereon. However, this method is not suited for mass-production since the thermal etching is unstable and it needs the MBE apparatus of a very high degree of vacuum. Quality of the crystal decreases, too, due to the heating. This invention therefore provides a fabrication process of semiconductor lasers in which the cover layer disappears due to interdiffusion of constituent elements that stem from the diffusion of impurities such as zinc ions in the undoped GaAs layer.

26 Claims, 2 Drawing Sheets

FABRICATION PROCESS OF SEMICONDUCTOR LASERS

BACKGROUND OF THE INVENTION

The present invention relates to a crystal growing technique and processing technique for easily obtaining semiconductor lasers which have a desired structure for confining optical transverse modes.

Namely, the present invention relates to a process for fabricating semiconductor lasers of the internal stripe self-aligned type formed by the organometal chemical vapor deposition method or by the molecular beam epitaxial method, and more specifically to a method which prevents the formation of a degradation layer in the step of buried epitaxy.

To easily control the transverse mode of GaAlAs visible semiconductor lasers, there has been known a structure according to which an n-type GaAs layer is put on a p-type GaAlAs cladding layer, GaAs is removed from a laser active region only, and a p-type GaAlAs cladding layer is grown thereon.

According to this method, however, the surface of the active GaAlAs layer is exposed to the air; i.e., the surface is easily oxidized and defects develop in the interface when the cladding layer is formed thereon.

On the other hand, the GaAs layer is oxidized little and a good interface is obtained if the cladding layer is formed thereon. According to Tanaka et al., Applied Physics, Vol. 54, No. 11, 1985, p. 1209, Section 3, "Method of Producing Self-Aligned Lasers", a crystal is introduced into a molecular beam epitaxy (MBE) apparatus with a GaAs layer having a thickness of 0.1 to 0.2 $\mu$m being left on a p-GaAlAs layer, and is heated while it is being irradiated with an As molecular beam, and a thin GaAs layer is thermally etched so that a cladding p-GaAlAs layer is exposed under a high vacuum condition, and a p-GaAlAs layer is grown thereon. This method, however, requires an MBE apparatus which must maintain an ultra-high vacuum condition, and is not usable in the OMVPE (organometallic vapor phase epitaxy) that is tailored to mass-produce the devices.

In order to easily control the transverse mode in GaAlAs visible semiconductor lasers, there has been known a structure (SAS) in which an n-type GaAs layer is formed on a p-type GaAlAs cladding layer, the n-type GaAs layer is removed from the corresponding region of the laser active region only, and a p-type GaAlAs cladding layer is grown again (see the literature described above).

According to this method, however, the surface of the active GaAlAs cladding layer is exposed to the air. Therefore, the surface is oxidized and defects develop when the crystal is grown thereafter.

On the other hand, the GaAs layer is oxidized little, and a good interface is obtained if the crystal is grown thereon. According to Tanaka et al. (see the literature described above), a crystal is introduced into a molecular beam epitaxy (MBE) apparatus with a GaAs layer having a thickness of 0.1 to 0.2 $\mu$m being left on a p-GaAlAs layer, and is heated while it is being irradiated with an As molecular beam, and a thin GaAs layer is thermally etched so that a cladding p-GaAlAs layer is exposed under a high vacuum condition, and a p-GaAlAs layer is grown again thereon. This method, however, requires an ultra-high vacuum condition and is not usable for the MOCVD (metal organic chemical vapor deposition) that is tailored to mass-produce the devices.

SUMMARY OF THE INVENTION

The object of the present invention is to provide means which enables crystals to grow two or more times on the active surface of a semiconductor so that a semiconductor layer will have an internal structure that confines the transverse mode, said means being adaptable to OMVPE and MOCVD for mass-producing the devices.

In other words, the present invention is to provide a process for fabricating semiconductor lasers maintaining good reproduceability and stable electric and optical characteristics. In particular, the object of the present invention is to improve the quality of the interface that is epitaxially grown two times in a step for forming an internal current confinement structure by the OMVPE method or the MOCVD method, in order to increase the reproduceability of the structure and to improve the stability of characteristics.

The present invention deals with a process for fabricating a semiconductor laser composed of a crystal of stable and good quality, by forming, as a cover layer, a thin semiconductor film having a stable surface on the unstable surface of a semiconductor, and then substantially smearing the cover layer by utilizing the interdiffusion of composed atoms at the hetero-interface.

In a conventional semiconductor laser having a transverse mode control structure formed by the organometal chemical vapor deposition method, an n-GaAs current confinement layer is removed by chemical etching, a p-type GaAlAs cladding layer is exposed, and then a laser structure is formed by the buried epitaxial method. During and after the etching, therefore, the degradation layer formed by the oxidation of the GaAlAs layer causes the electric and optical properties to become unstable.

The present invention modifies the above steps for fabricating the laser. Namely, the present invention fabricates a laser based upon the combination of a step which, in order to preclude the above unstabilizing factors, employs structure of a GaAs layer and very thin GaAlAs layer, and a forms a chemically inert GaAs layer as the uppermost layer so that the GaAs film is smeared by the impurity-induced interdiffusion of composed atoms at the hetero-interface, and a step which employs a selectively growing technique for forming an n-GaAs current confinement layer that gives a transverse mode confinement function to the laser.

In short, the present invention is concerned with a process for fabricating semiconductor lasers wherein a first semiconductor structure having an unstable surface is formed on a semiconductor substrate in a crystal growing chamber, a second semiconductor film structure having a stable surface is formed thereon, a predetermined processing such as etching is done outside said crystal growing chamber, a third semiconductor layer is grown in said growing chamber, said third semiconductor layer having a band gap greater than said second semiconductor structure, said first, second and third semiconductor structures or said second and third semiconductor structures are transformed into a mixed crystal by leaving them at the crystal growth temperature or by heating them utilizing the action of impurities that have been doped in the third semiconductor in advance, or that are added to said third semiconductor by diffusion, ion implantation, in order to increase the band gap of said second semiconductor structure by intermixing of the hetero-structure.

The present invention provides a method of regrowing the GaAlAs layer on the GaAlAs layer maintaining good reproduceability in the crystal growing method such as OMVPE or MOCVD adapted to mass-producing the devices. This method makes it possible to increase the yield of crystal growth by three times, to simplify the step of inspection, and to greatly reduce the manufacturing cost.

According to the present invention, a process for fabricating a semiconductor laser by the organometallic chemical vapor deposition employs a selective area epitaxy using an $SiO_2$ mask to form an n-GaAs current confinement layer in order to obtain an internal stripe structure, and an impurity induced intermixing to get good quality hetero structure interface. Therefore, the process of the present invention does not form a degradation layer that was a defect inherent in the conventional process. This makes it possible to stabilize electric and optical characteristics of the semiconductor laser diode and to accomplish a high yield. Therefore, the semiconductor laser can be cheaply produced featuring high competitiveness in cost and finds wide applications for consumer use and data terminals.

Examples of the crystal growing method that can be adapted to the present invention include an OMVPE (organometal vapor phase epitaxy) method and an MBE (molecular beam epitaxy) method.

DETAILED DESCRIPTION OF THE PRESENTLY PREFERRED EMBODIMENTS

Embodiment 1

Figure 1:
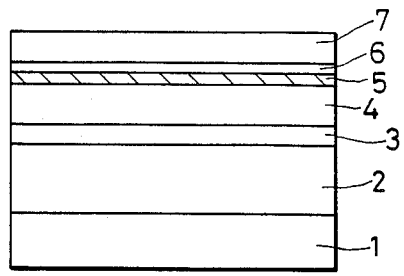
FIGS. 1 to 3 are section views of crystals grown by the crystal growing steps according to the present invention.

On an n-GaAs substrate 1 are formed an n-$Ga_{0.4}Al_{0.6}As$ cladding layer 2, a GaAs/$Ga_{0.5}Al_{0.5}As$ superlattice layer active layer 3, a p-$Ga_{0.4}Al_{0.6}As$ cladding layer 4, an undoped GaAs protecting layer (100 angstroms thick) 5, an undoped $Ga_{0.3}Al_{0.7}As$ layer (0.2 μm thick) 6 and an n-GaAs absorbing layer 7 in the order mentioned by the OMVPE method. Here, magnesium ions are doped as p-type impurities to the layer 4.

The crystal is taken out from the crystal growing chamber of the crystal growing apparatus, a photoresist mask is formed by the ordinary photolithography, the GaAs layer 7 is subjected to selective dry etching using a $Cl_2F_2$ gas, and a GaAs layer 7 which is in portion 10 on an active layer of the laser is removed in the form of a stripe having a width of 3 μm.

Then, using a mixture solution of hydrofluoric acid and ammonium peroxide (1:6), the $Ga_{0.3}Al_{0.7}As$ layer 6 is removed from the region 10.

The crystal is immediately introduced again into the OMVPE growing chamber, and the crystals are grown in the second time.

Figure 2:
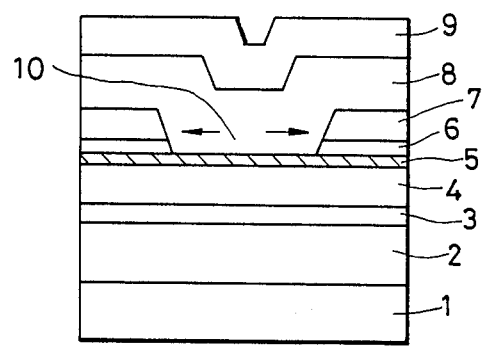

There are grown a p-$Ga_{0.4}Al_{0.6}As$ cladding layer 8 with zinc as a dopant, and a p-GaAs cap layer. FIG. 2 shows the crystals in cross section in this step.

Figure 3:
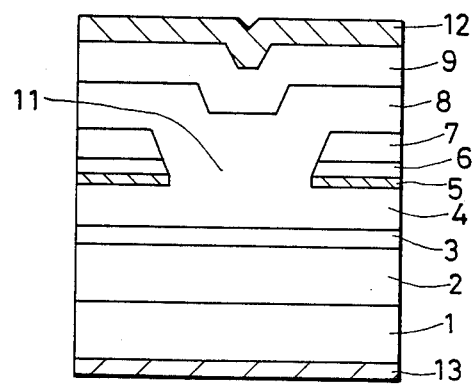

FIG. 3 is a section view of the laser when the crystals are heat-treated under As pressure at 850° C. for one hour. The thin GaAs layer 5 that corresponds to the region 10 is disappearing due to the impurity diffusion induced intermixing of hetero structure.

A p-side electrode 12 and an n-side electrode 13 are formed followed by cleavage and fabrication to produce a semiconductor laser according to an ordinary process for producing semiconductor lasers. The oscillation threshold current of the semiconductor laser is 15 mA, and the output is 150 mW. The variance of the threshold value among 10 wafers is ±2% indicating the fact that the crystal is grown maintaining very good reproduceability.

Embodiment 2

Figure 4A:
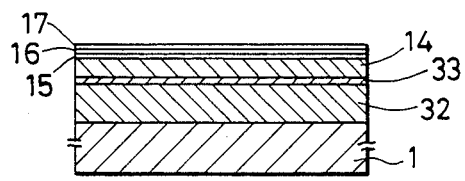
FIGS. 4a to 4f are section views of a laser structure to illustrate steps for fabricating a laser according to the present invention.

An $n^+$-GaAs substrate is chemically etched, washed, and is set into an MO-CVD furnace. After sufficiently substituting with an $H_2$ gas, the substrate is heated up to 500° C. by the high-frequency induction heating system and, at this moment, an $AsH_3$ gas is introduced thereto. Thereafter, the substrate is maintained at a temperature of 750° C. After about five minutes have passed, there are formed as shown in FIG. 4a an n-$Ga_{0.55}Al_{0.45}As$ layer (1.5 μm thick, n~$1\times10^{18}$ cm$^{-3}$) 32, an undoped $Ga_{0.86}Al_{0.14}As$ layer (0.08 μm thick) 33, a p-$Ga_{0.55}Al_{0.45}As$ layer (0.25 μm thick, p~$5\times10^{17}$ cm$^{-3}$) 14, an undoped $Ga_{1-x}Al_xAs$ layer (100 angstroms thick, X>0.4) 15, an undoped GaAs layer (100 angstroms thick) 16, and an undoped $Ga_{1-x}Al_xAs$ layer (100 angstroms thick, X>0.45) 17 in the order mentioned using organometals such as trimethylgallium (TMG), trimethylaluminum (TMA) and dimethylzinc (DMA, p-type dopant), and hydrides of the V-group such as hydrogen selenide ($H_2Se$, n-type dopant) and the like.

Figure 4B:
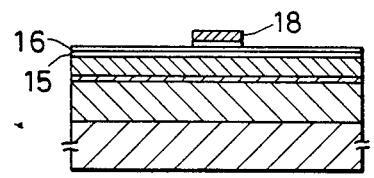

Then, an $SiO_2$ film is formed maintaining a thickness of about 2000 angstroms by chemical vapor deposition on the whole surface of the wafer which is provided with an epitaxial layer. Thereafter, an $SiO_2$ film 18 is formed by the photoetching method in the form of a stripe having a width of 3 to 5 μm (FIG. 4b).

Figure 4C:
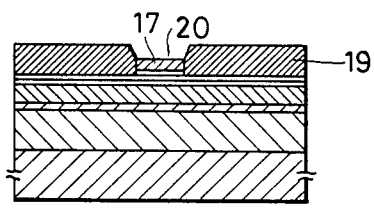
Figure 4D:
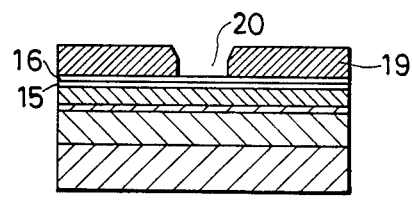
Figure 4E:
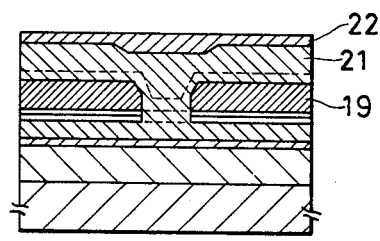
Figure 4F:
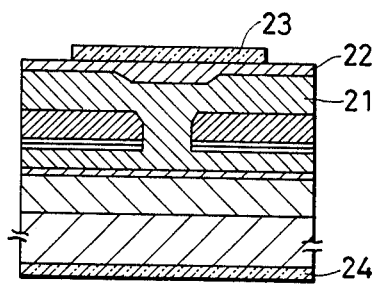

Then, with the $SiO_2$ film as a mask, the undoped GaAlAs layer 17 having a thickness of 100 angstroms is removed by etching, so that the undoped GaAs layer 16 is exposed. The wafer is set into the furnace again, and a selective epitaxial current confinement layer 19 having a thickness of 0.5 μm and n~$1\times10^{18}$ cm$^{-3}$ is formed by the thermal decomposition of $AsH_3$, TMG and $H_2Se$ effected at a growth temperature of 700° C. for 10 minutes. In this case, a recessed portion of a trapezoidal shape is formed in the $SiO_2$ mask, i.e., a striped groove 20 is formed (FIG. 4c). Thereafter, the $SiO_2$ film 18 and the undoped GaAlAs layer 17 remaining in the form of a stripe are removed by etching using an HF-$H_2O$ (1:1) liquid (FIG. 4d). After the pre-treatment and washing the wafer is set into the furnace again, and there are continuously and epitaxially grown a p-$Ga_{0.55}Al_{0.45}As$ cladding layer (1.5 μm thick, p~$5\times10^{18}$ cm$^{-3}$) 21 and a p$^+$-GaAs cap layer (0.5 μm thick, p~$5\times10^{19}$ cm$^{-3}$) 22 at a temperature of 750° C. (FIG. 4e). On the wafer are formed a p-electrode 23 and an n-electrode 24, and a semiconductor laser chip is formed (FIG. 4f) by the cleavage method to have a cavity length of 300 μm. Namely, there is obtained a stable visible semiconductor laser of a transverse mode which, when a current is supplied, exhibits an oscillation threshold value of 50 mA, an oscillation wavelength of 780 nm, and an optical output of 20 nW. A reliability test at 70° C. proves that the optical output is not markedly deteriorated even after 2000 hours have passed.

In the above embodiment, the undoped GaAlAs layer 15, the undoped GaAs layer 16 and the undoped GaAlAs layer 17 each possessed a thickness of 100 angstroms. However, the intermixing of the hetero structure can be realized if use is made of the p-GaAlAs layer 21 doped with impurities (for example, zinc ions) at a concentration of $5 \times 10^{18}$ cm$^{-3}$ or more, provided the thickness lies over a range of from 50 angstroms to 1000 angstroms. The whole concentration of the p-GaAlAs layer 21 need not necessarily be $5 \times 10^{18}$ cm$^{-3}$ or more, i.e., the impurities need be doped at a high concentration only in the initial stage of growth of from 0.2 to 0.3 $\mu$m (see FIG. 4e). Further, the AlAs concentration is heightened only during the initial stage of growth of the p-GaAlAs layer 21 in order to assist the intermixing of hetero structure of an ultrathin GaAlAs-GaAs layer.

This embodiment has dealt with a refractive index guided semiconductor laser in which the p-Ga$_{0.55}$Al$_{0.45}$As cladding layer possessed a thickness of as small as 0.25 $\mu$m on the undoped Ga$_{0.86}$Al$_{0.14}$As active layer. There can, however, be provided a gain guided semiconductor laser having the cladding layer with a thickness of greater than 0.4 $\mu$m. The laser can similarly be provided even when the active layer thereof has a multi-quantum well structure consisting of a GaAs well layer and a GaAlAs barrier layer.

Though the above embodiments have dealt with the GaAs/GaAlAs system only, it should be noted that the contents of the present invention can be embodied even when other materials are combined such as InP/InGaAsP system or InGaP/InGaAlP system through the same process.

What is claimed is:

1. A fabrication process of semiconductor lasers, comprising:
   a step for successively growing a first semiconductor structure, a second semiconductor thin structure for protecting the first semiconductor structure from oxidation, and a third semiconductor layer having a band gap greater than that of said second semiconductor structure but smaller than that of said first semiconductor structure in a crystal growing chamber;
   a step of forming on said third semiconductor layer, a stripe composed of an insulating film, outside said crystal growing chamber;
   a step for growing a fourth semiconductor structure on the third semiconductor layer with aaid striped insulating film as a mask;
   a step for removing the insulating film outside said crystal growing chamber, and for removing the whole of said third semiconductor layer just under the insulating film and the surface portion of said fourth semiconductor structure;
   a step of growing a fifth semiconductor structure on said second semiconductor thin structure and on said fourth semiconductor structure, said fifth semiconductor structure having impurities doped thereinto and forming a hetero-structure with said second semiconductor thin structure; and
   a step for increasing the band gap of said second semiconductor thin structure relying upon the impurity diffusion induced intermixing of the hetero-structure that the fifth semiconductor structure forms with the second semiconductor thin structure, which intermixing is effected by the spatial replacement and exchange of constituent elements in said first and fifth semiconductor structures and said second semiconductor thin structure utilizing the impurities doped in the fifth semiconductor structure that is grown on said second semiconductor thin structure and said fourth semiconductor structure.

2. A fabrication process of semiconductor lasers according to claim 1, wherein said first semiconductor structure consists of a Ga$_{1-x}$Al$_x$As layer ($0.1 \leq x \leq 1$) and has a thickness over a range of 50 to 1000 angstroms, and said second semiconductor thin film structure consists of a GaAs layer and has a thickness over a range of 50 to 1000 angstroms.

3. A fabrication process of a semiconductor laser as claimed in claim 2, wherein $0.3 \leq x \leq 1$.

4. A fabrication process of a semiconductor laser comprising:
   a first step of growing first semiconductor layers on a substrate, said first semiconductor layers including an active layer;
   a second step of growing second semiconductor layers on said first semiconductor layers, said second semiconductor layers including a second sub-layer;
   a third step of forming a striped groove in the second semiconductor layers, a part of said second sub-layer being exposed at the striped groove;
   a fourth step of growing a fifth semiconductor layer on the exposed part of the second sub-layer, the fifth semiconductor layer having a larger band gap than that of the second sub-layer said fifth semiconductor layer being provided with impurities; and
   a fifth step of intermixing the fifth semiconductor layer and the second sub-layer, the intermixing being induced by diffusion of said impurities with which the fifth semiconductor layer is provided, the intermixed second sub-layer and fifth layer having a larger band gap than that of the second sub-layer.

5. A fabrication process of a semiconductor laser as claimed in claim 4, wherein said impurities are added to asid fifth semiconductor layer by diffusion or ion implantation after said fifth semiconductor layer is grown.

6. A fabrication process of a semiconductor laser as claimed in claim 4, wherein said third step of providing the striped groove and the step of growing the fifth semiconductor layer include the sub-steps of forming an insulating film on the second semiconductor layers except above the location of the striped groove; then performing selective removal of the second semiconductor layers, using said insulating film as a mask so as to form the striped groove; then removing said insulating film; and then providing said fifth semiconductor layer on said second semiconductor layers, including directly on the exposed part of the second sub-layer.

7. A fabrication process of a semiconductor laser as claimed in claim 6, wherein said insulating film is formed by providing an insulating layer for forming the insulating film on the entire substrate, and selectively removing said insulating layer so as to form said insulating film.

8. A fabrication process of a semiconductor laser as claimed in claim 6, wherein said fifth semiconductor layer is formed by metal organic chemical vapor deposition.

9. A fabrication process of a semiconductor laser as claimed in claim 4, wherein said fifth step is done at a crystal growth temperature for growing the fifth semiconductor layer.

10. A fabrication process of a semiconductor laesr as claimed in claim 6, wherein said fifth step is done by heating.

11. A fabrication process of a semiconductor laser as claimed in claim 4, wherein, in said fifth step, said fifth semiconductor layer and second sub-layer are intermixed so as to transform the fifth semiconductor layer and the second sub-layer into a mixed crystal.

12. A fabrication process of a semiconductor layer as claimed in claiam 6, wherein said active layer includes a superlattice structure.

13. A fabrication process of a semiconductor laser as claimed in claim 6, wherein said active layer includes a multi-quantum well structure.

14. A fabrication process of a semiconductor laser as claimed in claim 13, wherein said multi-quantum well structure includes a GaAs well layer and a GaAlAs barrier layer.

15. A fabrication process of a semiconductor laser as claimed in claim 4, wherein the fifth step is done by heating, the heating being performed so as to cause said intermixing, to transform the fifth semiconductor layer and second sub-layer into a mixed crystal.

16. A fabrication process of a semiconductor laser as claimed in claim 15, wherein said heating is performed at a temperature of 750°–850° C.

17. A fabrication process of a semiconductor laser as claimed in claim 6, wherein each of said first semiconductor layers, said second semiconductor layers, and said fifth semiconductor layer is formed by organometallic vapor phase epitaxy.

18. A fabrication process of a semiconductor laser as claimed in claim 6, wherein said impurities are zinc ions.

19. A fabrication process of a semiconductor laser as claimed in claim 18, wherein the zinc ions are included in said fifth semiconductor layer, at a concentration of at least $5 \times 10^{18}$ cm$^{-3}$, at least in a part of the fifth semiconductor layer formed on the exposed second sub-layer.

20. A fabrication process of a semiconductor laser as claimed in claim 4, wherein each of said first semiconductor layers, said second semiconductor layers, and said fifth semiconductor layer is formed by metal organic chemical vapor deposition.

21. A fabrication process of a semiconductor laser as claimed in claim 4, wherein said second sub-layer of the second semiconductor layers is made of a semiconductor material that is more resistant to oxidation than the semiconductor material of a sub-layer of the second semiconductor layers beneath the second sub-layer.

22. A fabrication process of a semiconductor laser comprising:
a first step of growing first semiconductor layers on a substrate, said first semiconductor layers including an active layer;
a second step of growing second semiconductor layers on said first semiconductor layers, the second semiconductor layers including a second sub-layer;
a third step of forming a striped groove in the second semiconductor layers, a part of the second sub-layer being exposed at the striped groove;
a fourth step of growing a fifth semiconductor layer on the exposed part of the second sub-layer, so as to form a hetero-structure with the exposed part of the second sub-layer, the fifth layer being provided with impurities; and
a fifth step of diffusing impurities provided in the layer so as to smear the hetero-structure.

23. A fabrication process of a semiconductor laser as claimed in claim 22, wherein said fifth step is performed by interdiffusing atoms of the second sub-layer and fifth semiconductor layer at the heterostructure interface.

24. A fabrication process of a semiconductor laser as claimed in claim 23, wherein said fifth semiconductor layer has impurities doped therein, and wherein said fifth step of interdiffusing atoms is induced by the diffusion of said impurities.

25. A fabrication process of a semiconductor laser as claimed in claim 24, wherein said second sub-layer of the second semiconductor layers is made of a semiconductor material that is more resistant to oxidation than the semiconductor material of a sub-layer of the second semiconductor layers, beneath the second sub-layer.

26. A fabrication process of a semiconductor laser as claimed in claim 22, wherein said second sub-layer of the second semiconductor layers is made of a semiconductor material that is more resistant to oxidation than the semiconductor material of a sub-layer of the second semiconductor layers beneath the second sub-layer.

* * * * *